(12) United States Patent
Cheng (10) Patent No.: US 12,218,245 B2
(45) Date of Patent: Feb. 4, 2025

(54) THIN FILM TRANSISTOR AND LIGHT-EMITTING DIODE BACKPLANE

(71) Applicant: TCL China Star Optoelectronics Technology Co., Ltd., Guangdong (CN)

(72) Inventor: Xi Cheng, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/419,354

(22) PCT Filed: May 31, 2021

(86) PCT No.: PCT/CN2021/097392
§ 371 (c)(1),
(2) Date: Jun. 29, 2021

(87) PCT Pub. No.: WO2022/241830
PCT Pub. Date: Nov. 24, 2022

(65) Prior Publication Data
US 2024/0030352 A1    Jan. 25, 2024

(30) Foreign Application Priority Data
May 21, 2021    (CN) .......................... 202110555450.7

(51) Int. Cl.
*H01L 29/786*    (2006.01)
*H01L 25/075*    (2006.01)
(Continued)

(52) U.S. Cl.
CPC .... *H01L 29/78645* (2013.01); *H01L 25/0753* (2013.01); *H01L 25/167* (2013.01); *H01L 27/1255* (2013.01); *H01L 29/78696* (2013.01)

(58) Field of Classification Search
CPC .......... H01L 29/78645; H01L 25/0753; H01L 25/167; H01L 27/1255; H01L 29/78696; H01L 29/78642; G09F 9/33
See application file for complete search history.

(56) References Cited

U.S. PATENT DOCUMENTS

2005/0145843 A1* 7/2005 Yin ..................... H01L 29/7855
257/E29.147
2005/0190177 A1* 9/2005 Yumoto ................ G09G 3/325
345/211
(Continued)

FOREIGN PATENT DOCUMENTS

| CN | 105473990 | 4/2016 |
|---|---|---|
| CN | 106684251 | 5/2017 |

(Continued)

OTHER PUBLICATIONS

Lee S., Li X., Mativenga M., Jang J. Bulk-Accumulation Oxide Thin-Film Transistor Circuits with Zero Gate-to-Drain Overlap Capacitance for High Speed. IEEE Electron Device Lett. 2015; doi: 10.1109/LED.2015.2489655. (Year: 2015).*

*Primary Examiner* — Samuel Park (57) ABSTRACT

The application discloses a thin film transistor and a light-emitting diode (LED) backplane. The thin film transistor includes: a first gate, a first insulating layer, a first source, a semiconductor layer, a first drain, a second insulating layer, and a second gate; the first insulating layer covers the first gate; the first source, the semiconductor layer, and the first drain are all disposed at a side of the first insulating layer away from the first gate; the second insulating layer covers the first drain, the semiconductor layer, and the first source; and the second gate is disposed on a surface of a side of the second insulating layer away from the first gate, wherein the (Continued)

first source, the semiconductor layer, and the first drain jointly constitute a vertical channel structure.

19 Claims, 5 Drawing Sheets

(51) Int. Cl.
*H01L 25/16* (2023.01)
*H01L 27/12* (2006.01)

(56) References Cited

U.S. PATENT DOCUMENTS

| | | | | |
|---|---|---|---|---|
| 2005/0275038 A1* | 12/2005 | Shih | ............... | H01L 29/78648 257/382 |
| 2007/0241334 A1* | 10/2007 | Nagata | ............ | H01L 29/78615 257/E27.113 |
| 2009/0302310 A1* | 12/2009 | Rinzler | ................ | B82Y 10/00 977/734 |
| 2011/0024755 A1* | 2/2011 | Korenari | .......... | H01L 29/78696 257/E29.288 |
| 2012/0319096 A1* | 12/2012 | Rinzler | ............... | H10K 10/491 438/257 |
| 2013/0240842 A1* | 9/2013 | Rinzler | ............... | H10K 59/125 257/329 |
| 2015/0076106 A1* | 3/2015 | Pellerite | .............. | H05K 9/0094 264/447 |
| 2016/0005850 A1* | 1/2016 | Zhao | ................. | H01L 29/0653 257/329 |
| 2016/0079429 A1* | 3/2016 | Ellinger | ............. | H01L 29/7869 257/43 |
| 2016/0079440 A1* | 3/2016 | Ellinger | ............. | H01L 29/7869 257/43 |
| 2016/0133754 A1* | 5/2016 | Moon | .............. | H01L 29/66742 257/66 |
| 2017/0098668 A1* | 4/2017 | Huitema | ................ | G06F 1/163 |
| 2018/0233599 A1* | 8/2018 | Wang | .............. | H01L 29/78648 |
| 2019/0131410 A1 | 5/2019 | Li et al. | | |
| 2021/0126016 A1* | 4/2021 | Li | ................... | H01L 29/78633 |
| 2021/0166618 A1* | 6/2021 | Baumheinrich | .... | G09G 3/2081 |

FOREIGN PATENT DOCUMENTS

| | | | |
|---|---|---|---|
| CN | 107180876 | | 9/2017 |
| CN | 107195687 | | 9/2017 |
| CN | 108155246 | | 6/2018 |
| CN | 109686744 | | 4/2019 |
| CN | 109786421 A | * | 5/2019 |
| CN | 110534577 | | 12/2019 |

* cited by examiner

THIN FILM TRANSISTOR AND LIGHT-EMITTING DIODE BACKPLANE

RELATED APPLICATIONS

This application is a National Phase of PCT Patent Application No. PCT/CN2021/097392 having International filing date of May 31, 2021, which claims the benefit of priority of Chinese Patent Application No. 202110555450.7 filed on May 21, 2021. The contents of the above applications are all incorporated by reference as if fully set forth herein in their entirety.

FIELD AND BACKGROUND OF THE INVENTION

The present application relates to the field of display, in particular to a thin film transistor and a light-emitting diode (LED) backplane.

As the high-end TV market has higher and higher requirements for picture quality, improving display image quality has become a new demand for high-end TVs. At present, an 8K organic light-emitting diode (OLED) faces problems such as limitations by compensation circuit, indium gallium zinc oxide (IGZO) backplane technology, and driver design, and needs to be further developed. As a brand-new display technology, miniature LED has advantages over OLEDs and liquid crystal displays in terms of brightness and power consumption.

A difference between a miniature LED backlight and a traditional backlight is that the miniature LEDs can achieve a million-level contrast through local dimming. When a traditional backlight is turned on, all lamps will be turned on, and an area that is not displayed on a panel will also be irradiated by the backlight, causing the dark state to be not black enough and resulting in a low contrast. Meanwhile, the miniature LEDs can adapt to a display image of the panel to enable the backlight to turn on locally, and the backlight of the area that is not displayed on the panel is not turned on, achieving a completely black state, thereby achieving a million-level contrast. An active matrix (AM) miniature LED, as an active matrix driving technology, can greatly reduce a driving cost while improving display quality, and is therefore, currently developed by many companies.

However, since the miniature LED backplane is driven by current, higher requirements are put forward on a driving capability of a backplane thin film transistor (TFT) device. However, at present, amorphous silicon thin film transistors (a-Si TFTs) are limited by mobility, IGZO is limited by stability, and low-temperature poly-silicon (LTPS) is limited by complex manufacturing processes, resulting in excessively high costs and difficulty in meeting demands of a large size, so there are certain challenges in AM miniature LED applications. In addition, miniature LED drivers have higher requirements for TFT leakage, and excessive TFT leakage current will cause uneven brightness of the miniature LEDs.

SUMMARY OF THE INVENTION

Embodiments of the present application provide a film transistor and a light-emitting diode (LED) backplane, which can solve the problem that a leakage current driving capability of the existing thin film transistor cannot meet requirements of active matrix (AM) miniature LEDs.

In a first aspect, an embodiment of the present application provides a thin film transistor, which includes:

a first gate;
a first insulating layer covering the first gate;
a first source disposed at a side of the first insulating layer away from the first gate;
a semiconductor layer disposed at the side of the first insulating layer away from the first gate;
a first drain disposed at the side of the first insulating layer away from the first gate;
a second insulating layer covering the first drain, the semiconductor layer, and the first source; and
a second gate disposed on a surface of a side of the second insulating layer away from the first gate,
wherein the first source, the semiconductor layer, and the first drain jointly constitute a vertical channel structure, the first source is electrically connected to a surface of a side of the semiconductor layer close to the first gate through a first conductive film, the first drain is electrically connected to a surface of a side of the semiconductor layer away from the first gate through a second conductive film, the first conductive film is a silver nanowire film, and the second conductive film is a silver nanowire film.

Optionally, in some embodiments of the present application, the first source and the semiconductor layer are both disposed on a surface of a side of the first insulating layer away from the first gate, the first conductive film extends from a surface of the first source to a surface of a side of the semiconductor layer close to the first gate, and at least partially covers the surface of the first source and at least partially covers the surface of the side of the semiconductor layer close to the first gate.

Optionally, in some embodiments of the present application, the first conductive film is disposed on the first insulating layer, and the first source and the semiconductor layer are both disposed on the first conductive film.

Optionally, in some embodiments of the present application, the first conductive film is disposed on a surface of the first source away from the first gate and the surface of the first insulating layer away from the first gate, and the semiconductor layer is disposed on a surface of a side of the first conductive film on the first insulating layer away from the first gate.

Optionally, in some embodiments of the present application, the first source is disposed on the surface of the side of the first insulating layer away from the first gate, the first conductive film is disposed on a surface of a side of the first source away from the first gate, and the semiconductor layer is disposed on a surface of a side of the first conductive film away from the first gate.

Optionally, in some embodiments of the present application, the first drain is stacked on a surface of a side of the semiconductor layer away from the first gate, and the second conductive film is disposed between the first drain and the semiconductor layer.

In a second aspect, another embodiment of the present application provides a thin film transistor, which includes:

a first gate;
a first insulating layer covering the first gate;
a first source disposed at a side of the first insulating layer away from the first gate;
a semiconductor layer disposed at the side of the first insulating layer away from the first gate;
a first drain disposed at the side of the first insulating layer away from the first gate;
a second insulating layer covering the first drain, the semiconductor layer, and the first source; and a second gate disposed on a surface of a side of the second insulating layer away from the first gate, wherein the first source, the semiconductor layer, and the first drain jointly constitute a vertical channel structure.

Optionally, in some embodiments of the present application, the first source is electrically connected to a surface of a side of the semiconductor layer close to the first gate, and the first drain is electrically connected to a surface of a side of the semiconductor layer away from the first gate.

Optionally, in some embodiments of the present application, the first source is electrically connected to the surface of the side of the semiconductor layer close to the first gate through a first conductive film, and the first conductive film has at least one through hole.

Optionally, in some embodiments of the present application, the first conductive film is an indium tin oxide film with the at least one through hole or a metal film with the at least one through hole.

Optionally, in some embodiments of the present application, the first conductive film is a silver nanowire film.

Optionally, in some embodiments of the present application, the first source and the semiconductor layer are both disposed on a surface of a side of the first insulating layer away from the first gate, the first conductive film extends from a surface of the first source to a surface of a side of the semiconductor layer close to the first gate, and at least partially covers the surface of the first source and at least partially covers the surface of the side of the semiconductor layer close to the first gate.

Optionally, in some embodiments of the present application, the first source is disposed on the surface of the side of the first insulating layer away from the first gate, the first conductive film is disposed on a surface of a side of the first source away from the first gate, and the semiconductor layer is disposed on a surface of a side of the first conductive film away from the first gate.

Optionally, in some embodiments of the present application, the first drain is disposed on the surface of the side of the semiconductor layer away from the first gate and partially covers the semiconductor layer, an orthographic projection of the second gate at least partially overlaps an orthographic projection of the semiconductor layer, and the orthographic projection of the second gate does not overlap an orthographic projection of the first drain.

Optionally, in some embodiments of the present application, the first drain is stacked on a surface of a side of the semiconductor layer away from the first gate, a second conductive film is disposed between the first drain and the semiconductor layer, and the second conductive film has at least one through hole.

Optionally, in some embodiments of the present application, the second conductive film is an indium tin oxide film with the at least one through hole or a metal film with the at least one through hole.

In a third aspect, still another embodiment of the present application also provides a light-emitting diode (LED) backplane, which includes at least one of the thin film transistors described above, and the thin film transistor serves as a driving thin film transistor of an LED.

Optionally, in some embodiments of the present application, the LED is a mini-LED.

Optionally, in some embodiments of the present application, the LED backplane includes a 2T1C (two transistor and one capacitor) circuit structure, and the 2T1C circuit structure includes:

a driving thin film transistor;

a switching thin film transistor, including a third gate, a second source, and a second drain, wherein the third gate is configured to receive a first scan signal, and the second source is configured to receive a data signal;

a storage capacitor, wherein a terminal of the storage capacitor is connected to a first drain of the switching thin film transistor, and another terminal of the storage capacitor is grounded; and a light-emitting diode (LED), wherein the first gate of the driving thin film transistor is connected to the second drain of the switching thin film transistor, the second gate of the driving thin film transistor is configured to receive a second scan signal, a first source of the driving thin film transistor is connected to a terminal of the LED, another terminal of the LED is configured to receive a working voltage signal, and the first drain of the driving thin film transistor is grounded.

Compared with the prior art, the thin film transistor described in an embodiment of the present application adopts a double-gate vertical channel structure, and a length of the vertical channel is a thickness of the semiconductor layer, which can be at a nanometer scale, which enables the thin film transistor to have an ultra-high on-state current and greater driving capability, and the double-gate structure having upper and lower gates can reduce leakage current and can also control a threshold voltage. In addition, use of the thin film transistors described in the embodiments of the present application for LED backplanes (such as miniature LED backplanes) can improve a driving capability of the LED backplanes, and low leakage current characteristics of the thin film transistors can further improve brightness uniformity of LEDs.

DESCRIPTION OF SPECIFIC EMBODIMENTS OF THE INVENTION

Embodiment of the present application provide an organic light emitting display panel and a display device. Detailed descriptions are given below. It should be noted that the order of description in the following embodiments is not meant to limit the preferred order of the embodiments.

Referring to FIGS. 2 to 9, embodiments of the present application provide a thin film transistor (TFT) and a miniature LED backplane, which will be described in detail below. It should be noted that the order of description in the following embodiments is not meant to limit the preferred order of the embodiments.

Referring to FIGS. 2 to 5, Embodiment 1 of the present application provides a thin film transistor, specifically a thin film transistor with a double-gate vertical channel structure. The thin film transistor described in Embodiment 1 of the present application may be an N-type TFT (using electrons as carriers) or a P-type TFT (using holes as carriers). The thin film transistor includes a first gate 100, a first insulating layer 200, a first source 300, a semiconductor layer 500, a first drain 700, a second insulating layer 800, and a second gate 900.

A material of the first gate 100 is a metal material, which can be manufactured by physical vapor deposition (PVD).

Referring to FIGS. 2 to 5, the first insulating layer 200 covers the first gate 100. A material of the first insulating layer 200 is an insulating material. The first insulating layer 200 may be made by spin coating, chemical vapor deposition (CVD), or blade coating.

Referring to FIGS. 2 to 5, the first source 300, the semiconductor layer 500, and the first drain 700 are all disposed on a side of the first insulating layer 200 away from the first gate 100, and the first source 300, the semiconductor layer 500, and the first drain 700 jointly form a vertical channel structure. A material of the first source 300 is a metal material, which can be made by spin coating or blade coating. The first drain 700 is made of metal materials, which can be made by physical vapor deposition or evaporation coating. A material of the semiconductor layer 500 can be an organic semiconductor material, which can be made by spin coating or blade coating; and the material of the semiconductor layer 500 can also be an inorganic semiconductor material, which can be made by chemical vapor deposition and photolithography process.

Specifically, the first source 300 is electrically connected to a surface of a side of the semiconductor layer 500 close to the first gate 100, and the first drain 700 is electrically connected to a surface of a side of the semiconductor layer 500 away from the first gate 100. As such, the first source 300, the semiconductor layer 500, and the first drain 700 jointly form a vertical channel structure.

In one embodiment, referring to FIGS. 2 to 5, the first source 300 is electrically connected to the surface of the side of the semiconductor layer 500 close to the first gate 100 through the first conductive film 400, and the first conductive film 400 has at least one through hole. The through hole can allow an electric field of the first gate 100 to pass therethrough to control carriers in the semiconductor layer 500, thereby preventing the electric field of the first gate 100 from being shielded by the first source 300, which is made of a whole layer of metal. It should be noted that the through hole of the first conductive film 400 refers to a through hole penetrating the first conductive film 400 in a thickness direction of the first conductive film 400 (a direction perpendicular to the first gate 100). A number of the through holes may be one or more (for example, two, three or more), and a shape of the through holes may be a regular shape (for example, circular, rectangular, or polygonal), or an irregular shape. A size of the through holes includes, but is not limited to, nanoscale. When the number of through holes is three or more, they can be arranged regularly or irregularly. The first conductive film 400 may be, for example, an indium tin oxide (ITO) film with at least one through hole, which may be prepared by making a lot of nano-holes in the ITO film, wherein the nano-holes penetrate through a surface of a side of the ITO film away from the first gate 100 and a surface of a side of the ITO film close to the first gate 100. The first conductive film 400 may also be, for example, a metal film with at least one through hole. A material of the metal thin film is, for example, gold, silver, aluminum, or the like. In one embodiment, the first conductive film 400 is a silver nanowire film. Since a shape of the silver nanowires is linear, many silver nanowires in the silver nanowire film cross each other to form a network structure or a network-like structure, so that the electric field of the first gate 100 can penetrate the silver nanowire film to control the carriers in the semiconductor layer 500. The silver nanowire film can be prepared by spin-coating a solution containing silver nanowires, or can be prepared by self-assembly.

Figure 3:
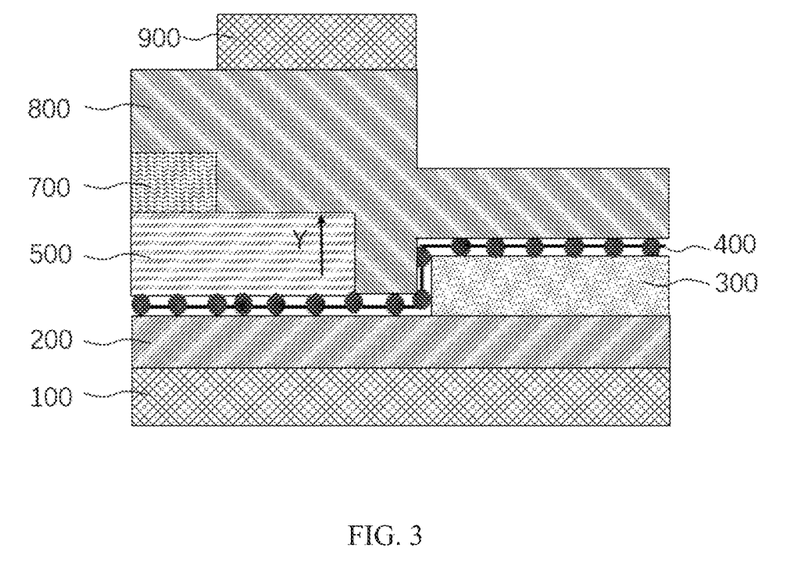
FIG. 3 is a schematic cross-sectional view of the first structure of the thin film transistor provided by Embodiment 1 of the present application.
Figure 4:
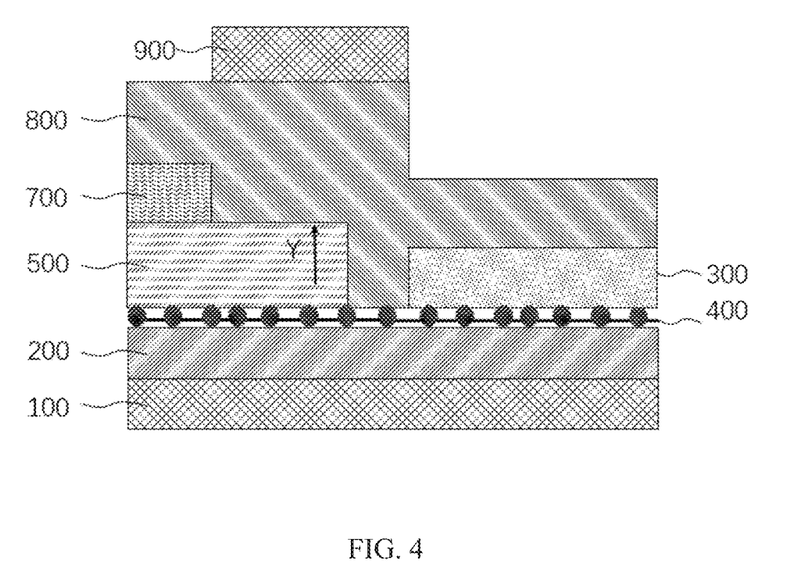
FIG. 4 is a schematic cross-sectional view of a second structure of the thin film transistor provided by Embodiment 1 of the present application.

Exemplarily, referring to FIGS. 3 and 4, the first source 300 and the semiconductor layer 500 may be arranged in the same layer (not stacked). Specifically, the first source 300 and the semiconductor layer 500 are all provided on the surface of the side of the first insulating layer 200 away from the first gate 100, and the first conductive film 400 extends from a surface of the first source 300 to the surface of the side of the semiconductor layer 500 close the first gate 100, and at least partially covers the surface of the first source 300 and at least partially covers to the surface of the side of the semiconductor layer 500 close to the first gate 100 (that is, an orthographic projection of the semiconductor layer 500 overlaps an orthographic projection of the first conductive film 400). It is appreciated that, referring to FIG. 3, a part of the first conductive film 400 may partially cover at least the surface of the side of the first source 300 away from the first gate 100. In such a case, the part of the first conductive film 400 is provided on an upper surface and sidewalls of the first source 300, another part of the first conductive film 400 is provided on the first insulating layer 200, and the semiconductor layer 500 is provided on the first insulating layer 200 on the surface of the side of the first conductive film 400 away from the first gate 100. During manufacturing, the first source 300 can be prepared on the first insulating layer 200 first, then the first conductive film 400 (for example, a silver nanowire film) is prepared on the first source 300 and the first insulating layer 200, and hereafter a semiconductor layer 500 is prepared on the first conductive film 400 (the semiconductor layer 500 does not overlap the first source 300). It should be noted that the first conductive film 400 may partially cover the surface of the side of the first source 300 away from the first gate 100, or it may completely cover the surface of the side of the first source 300 away from the first gate 100. Similarly, the first conductive film 400 may partially cover the surface of the side of the semiconductor layer 500 close to the first gate 100, or it may completely cover the surface of the side of the semiconductor layer 500 close to the first gate 100. Referring to FIG. 4, the first conductive film 400 may also at least partially cover the surface of the side of the first source 300 close to the first gate 100 (that is, an orthographic projection of the first source 300 overlaps an orthographic projection of the first conductive film 400). In this case, the first conductive film 400 may be directly disposed on the first insulating layer 200, and the first source 300 and the semiconductor layer 500 are disposed on the first conductive film 400. During manufacturing, the first conductive film 400 may be prepared on the first insulating layer 200 first, and then the first source 300 and the semiconductor layer 500 may be prepared on the first conductive film 400. It should be noted that the first conductive film 400 may partially cover the surface of the side of the first source 300 close to the first gate 100, or may completely cover the surface of the side of the first source 300 close to the first gate 100. Similarly, the first conductive film 400 may partially cover the surface of the side of the semiconductor layer 500 close to the first gate 100, or may completely cover the surface of the side of the semiconductor layer 500 close to the first gate 100.

Figure 5:
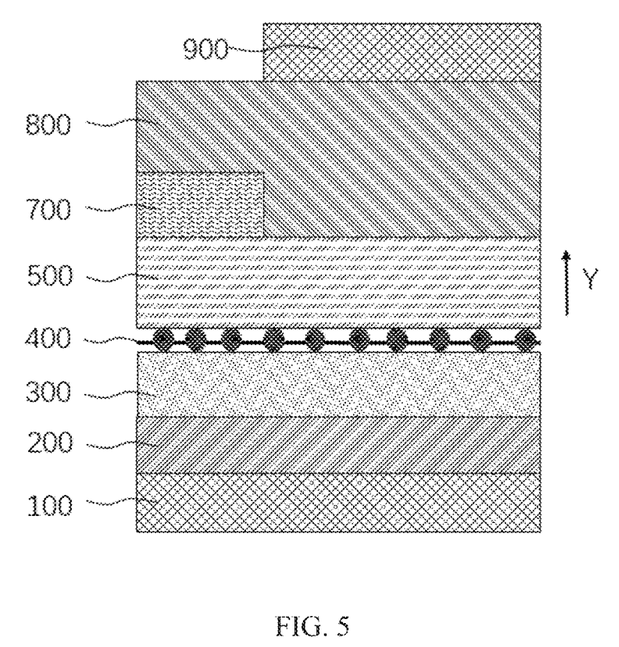
FIG. 5 is a schematic cross-sectional view of a third structure of the thin film transistor provided by Embodiment 1 of the present application.

Exemplarily, referring to FIG. 5, the first source 300 and the semiconductor layer 500 may also be stacked, and the first source 300 is disposed on the surface of the side of the first insulating layer 200 away from the gate 100, the first conductive film 400 is provided on the surface of the side of the first source 300 away from the first gate 100, and the semiconductor layer 500 is provided on the surface of the side of the first conductive film 400 away from the first gate 100, that is, the first source 300, the first conductive film 400, and the semiconductor layer 500 are sequentially stacked. In this embodiment, since the first conductive film 400 has through holes, the electric field of the first gate 100 can pass through the through holes to control the carriers in the semiconductor layer 500 without being shielded by the first source 300.

Figure 1:
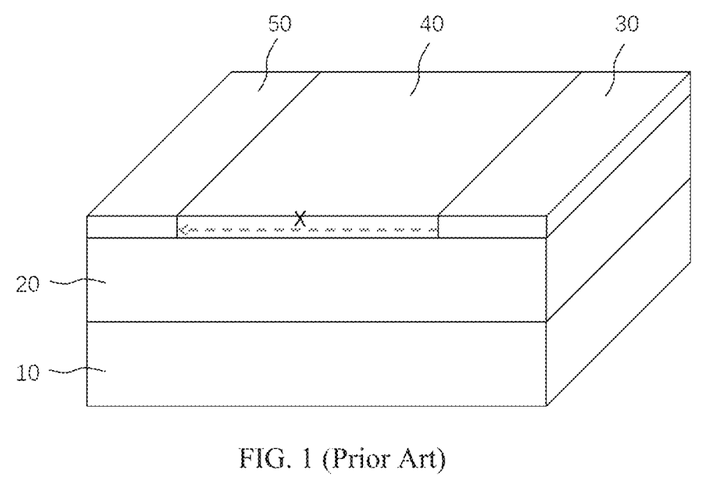
FIG. 1 is a three-dimensional schematic diagram of a structure of a thin film transistor with a traditional planar structure in the prior art.
Figure 2:
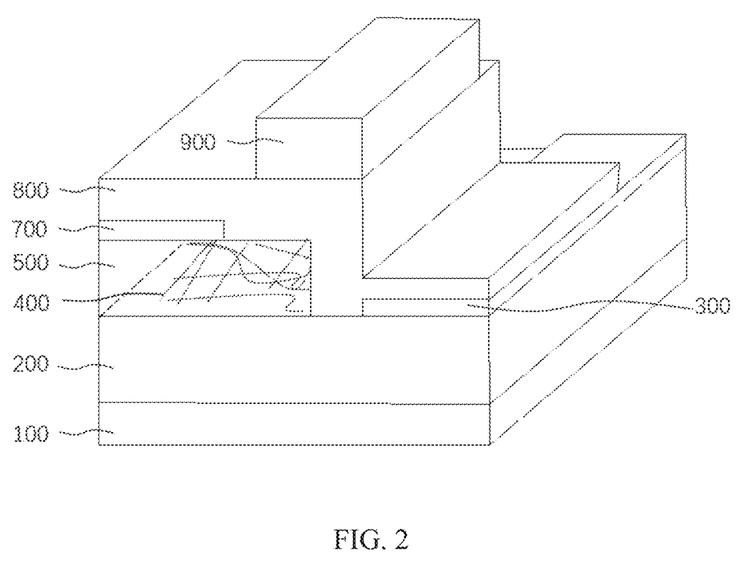
FIG. 2 is a three-dimensional schematic diagram of a first structure of a thin film transistor provided by Embodiment 1 of the present application.

A conventional planar thin film transistor is more commonly used in the prior art. Referring to FIG. 1, the conventional planar thin film transistor includes a gate a dielectric insulating layer 20, a source 30, a channel layer 40, and a drain 50. The source 30, the drain 50, and the channel layer 40 are arranged horizontally in the same layer, and a carrier transporting direction or a current direction is in the horizontal transporting direction (for example, the X direction as shown in FIG. 1). Because the traditional planar thin film transistor is limited by an accuracy of an exposure tool, the shortest channel length can only be at a micrometer scale (for example, about 10 microns), which results in low output current of the planar thin film transistor and limited driving capability.

The thin film transistor described in the embodiment of the application adopts a vertical channel structure, the carrier transporting direction or current direction is a vertical transporting direction (for example, the Y direction shown in FIGS. 3 to 5), and the length of the vertical channel is the thickness of the semiconductor layer 500 which can be achieved at the nanoscale which is one percent or less of that of the traditional planar thin film transistor. Therefore, the thin film transistors described in the embodiments of the present application have ultra-high on-state current and greater driving capability.

Referring to FIGS. 2 to 5, the first drain 700 is provided on the surface of the semiconductor layer 500 away from the first gate 100 and partially covers the semiconductor layer 500. During manufacturing, the first drain 700 is directly fabricated on the semiconductor layer 500, and the semiconductor layer 500 is partially exposed from the first drain 700 by patterning.

Referring to FIG. 2 to FIG. 5, the second insulating layer 800 covers the first drain 700, the semiconductor layer 500, and the first source 300. A material of the second insulating layer 800 is an insulating material, which can be made by spin coating, chemical vapor deposition, and blade coating.

Referring to FIGS. 2 to 5, the second gate 900 is provided on a surface of the second insulating layer 800 away from the first gate 100. A material of the second gate 900 is a metal material, which can be manufactured by physical vapor deposition. Specifically, an orthographic projection of the second gate 900 at least partially overlaps an orthographic projection of the semiconductor layer 500, and the orthographic projection of the second gate 900 does not overlap the orthographic projection of the first drain 700, that is, a position of the second gate 900 corresponds to a part of the semiconductor layer 500 exposed from the first drain 700, so that an electric field of the second gate 900 can reach the semiconductor layer 500 and regulate the carriers of the semiconductor layer 500 without being shielded by the first drain 700.

The thin film transistor in an embodiment of the present application adopts a double-gate structure with upper and lower gates (that is, the first gate 100 and the second gate 900), which can not only enhance the gate's ability to control carriers, but also reduce the leakage current, as well as control a threshold voltage. When the thin film transistor is N-type, a working principle of the thin film transistor is as follows: (1) a turn-on phase: the first gate 100 is applied with a positive high-potential turn-on voltage to the semiconductor layer 500, and electrons are generated at an interface between the first conductive film layer and the semiconductor layer 500, and the thin film transistor is turned on; and the second gate 900 is applied with a negative voltage, which further causes the electrons in the semiconductor layer to gather toward a channel, thereby increasing carriers in the channel, thus increasing an on current; (2) a turn-off phase (in this phase, holes are mainly involved in conduction): the first gate 100 is applied with a negative voltage, the carriers of the semiconductor layer 500 at an interface between the channel and the semiconductor layer 500 are depleted, and the electrons move to a back channel (that is an interface between the semiconductor layer 500 and the second insulating layer 800), the holes move to the channel, and at this time only few holes in the channel participate in conduction; the second gate 900 is also applied with a negative voltage, and the holes in the back channel move forward to a front channel (that is, an interface between the semiconductor layer 500 and the first insulating layer 200), which reduces a number of holes moving to the channel, thereby reducing leakage current (off current).

When the thin film transistor is P-type, a working principle of the thin film transistor is as follows: (1) a turn-on phase: the first gate 100 is applied with negative high-potential turn-on voltage to the semiconductor layer 500, and holes are generated at an interface between the first conductive film layer and the semiconductor layer 500, and the thin film transistor is turned on; and the second gate 900 is applied with a positive voltage, which further causes the holes in the semiconductor layer to gather toward a channel, thereby increasing carriers in the channel, thus increasing an on current; (2) a turn-off phase (in this phase, electrons are mainly involved in conduction): the first gate 100 is applied with a positive voltage, the carriers of the semiconductor layer 500 at an interface between the channel and the semiconductor layer 500 are depleted, and the holes move to a back channel (that is an interface between the semiconductor layer 500 and the second insulating layer 800), the electrons move to the channel, and at this time only few electrons in the channel participate in conduction; the second gate 900 is also applied with a positive voltage, and the electrons in the back channel move forward to a front channel (that is an interface between the semiconductor layer 500 and the first insulating layer 200), which reduces a number of electrons moving to the channel, thereby reducing leakage current (off current).

Figure 6:
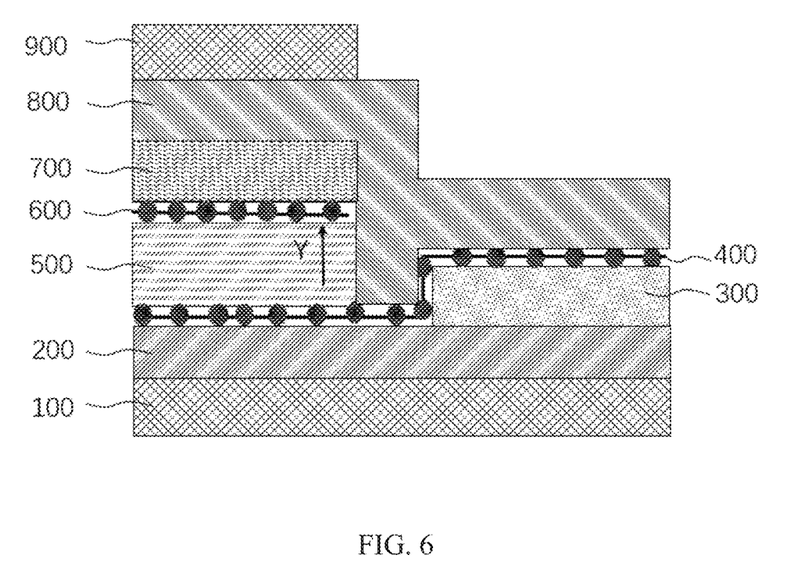
FIG. 6 is a schematic cross-sectional view of a first structure of a thin film transistor provided by Embodiment 2 of the present application.
Figure 7:
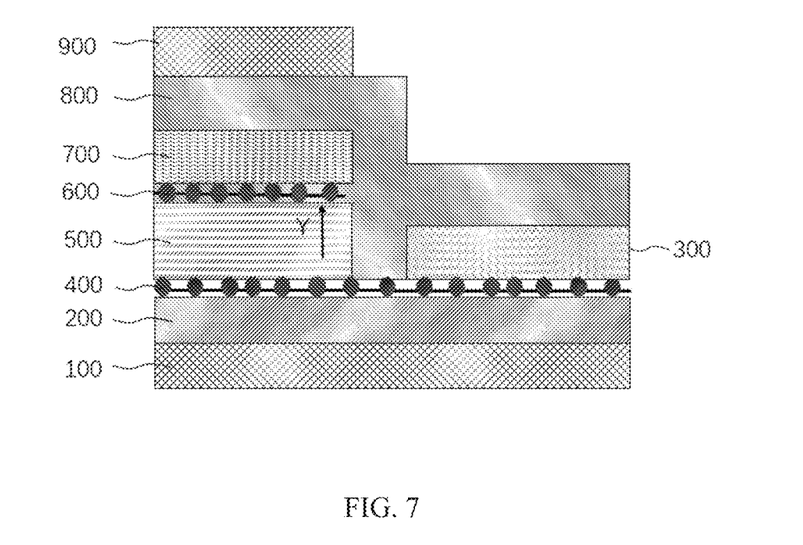
FIG. 7 is a schematic cross-sectional view of a second structure of the thin film transistor provided by Embodiment 2 of the present application.
Figure 8:
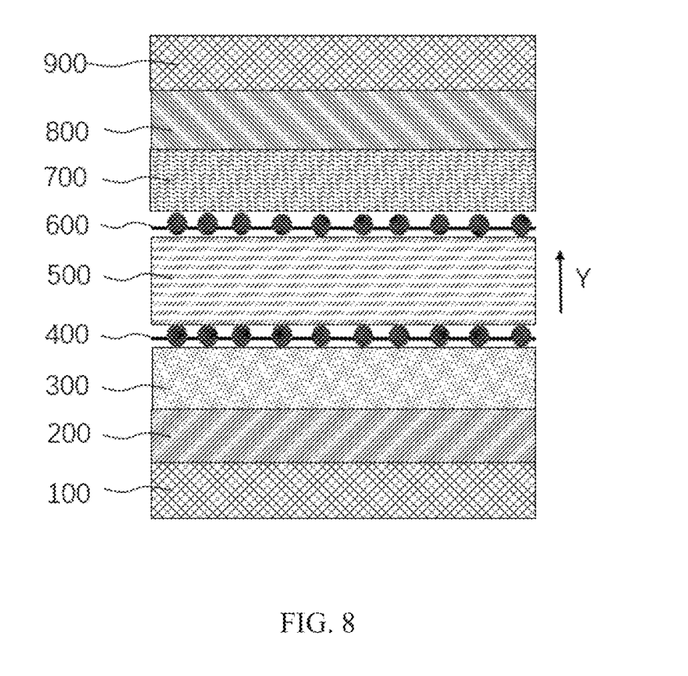
FIG. 8 is a schematic cross-sectional view of a third structure of the thin film transistor provided by Embodiment 2 of the present application.

Referring to FIGS. 6-8, the thin film transistor of Embodiment 2 of the present application is also the thin film transistor having a double-gate vertical channel structure, and may be an N-type TFT (using electrons as carriers) or a P-type TFT (using holes as carriers), which has a structure similar to that of Embodiment 1 of the present application, and the element names and reference numerals are substantially the same as those of Embodiment 1 of the present application. A difference from Embodiment 1 is that: the thin film transistor of Embodiment 2 is additionally provided with a second conductive film 600. Specifically, a first drain 700 is stacked on a surface of the side of a semiconductor layer 500 away from a first gate 100, the second conductive film 600 is provided between the first drain 700 and the semiconductor layer 500, and the second conductive film 600 has at least one through hole. In Embodiment 2 of the present application, the second conductive film 600 has the through hole, so that an electric field of the second gate 900 can pass through the through hole to control the carriers in the semiconductor layer 500, and prevent the electric field of the second gate 900 from being shielded by the whole layer of metal of the first drain 700.

It should be noted that the through hole of the first conductive film 400 refers to a through hole penetrating the first conductive film 400 in a thickness direction of the first conductive film 400 (a direction perpendicular to the first gate 100). A number of the through holes may be one or more (for example, two, three or more), and a shape of the through holes may be a regular shape (for example, circular, rectangular, or polygonal), or an irregular shape. A size of the through holes includes, but is not limited to, nanoscale. When the number of through holes is three or more, they can be arranged regularly or irregularly. Materials of the second conductive film 600 and the first conductive film 400 may be the same or different; and the second conductive film 600 and the first conductive film 400 will not make the source 300 and the first drain 700 short-circuit. The second conductive film 600 can be, for example, an indium tin oxide (ITO) film with at least one through hole, which may be prepared by making a lot of nano-holes in the ITO film, wherein the nano-holes penetrate through a surface of a side of the ITO film away from the first gate 100 and a surface of a side of the ITO film close to the first gate 100. The second conductive film 600 may also be, for example, a metal film with at least one through hole. A material of the metal thin film is, for example, gold, silver, aluminum, or the like. In one embodiment, the second conductive film 600 is a silver nanowire film.

In this embodiment, as in Embodiment 1, the first source 300 and the semiconductor layer 500 may be not stacked (referring to FIGS. 6 and 7), or the first source 300 and the semiconductor layer 500 may be stacked (referring to FIG. 8). Related descriptions can be referred to Embodiment 1.

In this embodiment, by adding the second conductive film 600, a position of the second gate 900 is not restricted by the first drain 700, so that the electric field of the second gate 900 can pass through the through hole of the second conductive film 600 to control the carriers in the semiconductor layer 500 and prevent the electric field of the second gate 900 from being shielded by the first drain 700 which is made of an whole layer of metal. Therefore, in this embodiment, the semiconductor layer 500 does not need to be specifically exposed from the first drain 700 to prevent the electric field of the second gate 900 from being shielded by the first drain 700, and the first drain 700 can completely cover the semiconductor layer 500, which simplifies the manufacturing process. During manufacturing, the second conductive film 600 with the through hole is prepared on the semiconductor layer 500, and then the first drain 700 is formed on the second conductive film 600.

In the above embodiments, the descriptions of each embodiment have their own emphasis. The parts that are not described in detail in an embodiment can be referred to the detailed descriptions in other embodiments above.

The thin film transistors described in the above embodiments of the present application can be used for LED backplanes.

Correspondingly, still another embodiment of the present application also provides a light-emitting diode (LED) backplane, which includes at least one of the thin film transistors described above, and the thin film transistor serves as a driving thin film transistor of an LED.

In an embodiment of the present application, since the driving thin film transistor has an ultra-high on-state current and a strong driving capability, a driving capability of the LED backplane (for example, miniature LED backplane) can be improved, and low leakage current characteristics of the driving thin film transistors can further improve brightness uniformity of LEDs, thereby solving the problem of uneven brightness of the LED (such as a miniature LED) caused by an excessively high leakage current of the thin film transistor. The voltage of the second gate 900 can also control the threshold voltage of the driving thin film transistor, which can meet the application in a light-emitting diode (LED) backplane (for example, a miniature LED backplane).

In an embodiment of the present application, the LED may be, for example, a miniature LED, which refers to a light-emitting diode (LED) device with a chip having a size ranging between 50 μm and 200 μm.

In an embodiment of the present application, the LED backplane may adopt a circuit structure such as two transistors and one capacitor (2T1C), three transistors and one capacitor (3T1C), six transistors and one capacitor (6T1C), seven transistors and one capacitor (7T1C), etc. It should be noted that a circuit composed of two thin film transistors (TFTs) and one storage capacitor (Cs) can be referred to as 2T1C for short according to the numbers of TFTs and Cs. Similarly, a circuit composed of three thin film transistors (TFTs) and one storage capacitor (Cs) can be referred to as 3T1C for short; a circuit composed of six thin film transistors (TFTs) and one storage capacitor (Cs) can be referred to as 6T1C for short; and a circuit composed of seven thin film transistors (TFTs) and one storage capacitor (Cs) can be referred to as 7T1C for short.

Figure 9:
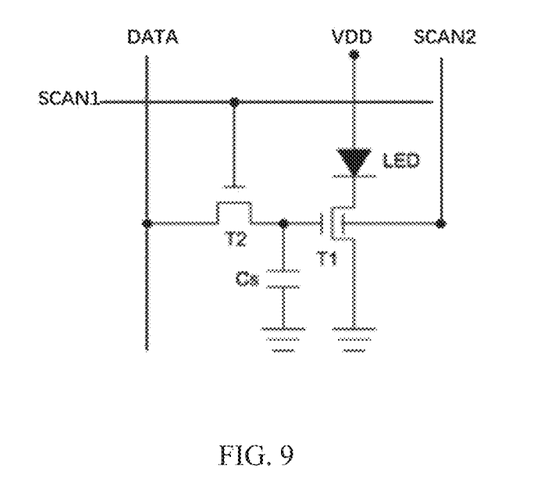
FIG. 9 is a circuit diagram of a two transistor and one capacitor (2T1C) circuit structure of a light-emitting diode (LED) backplane provided by an embodiment of the present application.

In one embodiment, referring to FIG. 9, the LED backplane includes a 2T1C circuit structure, and the 2T1C circuit structure includes: a switching thin film transistor (T2), a storage capacitor (Cs), a driving thin film transistor (T1), and a light-emitting diode (LED).

The switching thin film transistor (T2) includes a third gate, a second source, and a second drain. The third gate is connected to a first scan signal (SCANT). The second source is connected to a data signal (DATA). The switching thin film transistor may be, for example, a common a-Si thin film transistor.

One terminal of the storage capacitor (Cs) is connected to the first drain of the switching thin film transistor (T2), and another terminal is grounded.

The first gate of the driving thin film transistor (T1) is connected to the second drain of the switching thin film transistor (T2), and the second gate of the driving thin film transistor (T1) is connected to a second scan signal (SCAN2). The first source of the driving thin film transistor (T1) is connected to one terminal of the LED, another terminal of the LED is connected to a working voltage signal (VDD signal), and the first drain of the driving thin film transistor (T1) is grounded.

In this embodiment, a complexity of metal wiring can be reduced by using the 2T1C circuit.

In summary, the thin film transistor described in the embodiment of the application adopts a double-gate vertical channel structure, and a length of the vertical channel is a thickness of the semiconductor layer 500. Since the semiconductor layer 500 can be manufactured in nanoscale, which is one percent or even smaller of a size of a traditional planar thin film, it can enable the thin film transistor to have an ultra-high on-state current and greater driving capability, and the double-gate structure having upper and lower gates can reduce leakage current and can also control a threshold voltage. In addition, a use of the thin film transistors described in the embodiments of the present application for LED backplanes (such as a miniature LED backplanes) can improve a driving capability of the LED backplanes, and low leakage current characteristics of the thin film transistors can further improve brightness uniformity of LEDs.

The thin film transistor and the light-emitting diode (LED) backplane provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A thin film transistor, comprising:
    a first gate;
    a first insulating layer covering the first gate;
    a first source disposed at a side of the first insulating layer away from the first gate in a vertical direction perpendicular to an upper surface of the first gate;
    a semiconductor layer disposed at the side of the first insulating layer away from the first gate;
    a first drain disposed at the side of the first insulating layer away from the first gate;
    a second insulating layer covering the first drain, the semiconductor layer, and the first source; and
    a second gate disposed on a surface of a side of the second insulating layer away from the first gate in the vertical direction,
    wherein the first source, the semiconductor layer, and the first drain jointly constitute a vertical channel structure, the first source is electrically connected to a surface of a side of the semiconductor layer close to the first gate through a first conductive film, the first drain is electrically connected to a surface of a side of the semiconductor layer away from the first gate through a second conductive film, the first conductive film is a silver nanowire film, and the second conductive film is a silver nanowire film,
    wherein in a horizontal direction parallel to the upper surface of the first gate, the first source and the semiconductor layer are spaced apart and the second insulating layer is disposed between the first source and the semiconductor layer, and
    wherein the semiconductor layer does not overlap the first source in the vertical direction.

2. The thin film transistor according to claim 1, wherein the first source and the semiconductor layer are both disposed on a surface of the side of the first insulating layer away from the first gate, the first conductive film extends from a surface of the first source to the surface of the side of the semiconductor layer close to the first gate, and at least partially covers the surface of the first source and at least partially covers the surface of the side of the semiconductor layer close to the first gate.

3. The thin film transistor according to claim 2, wherein the first conductive film is disposed on the first insulating layer, and the first source and the semiconductor layer are both disposed on the first conductive film.

4. The thin film transistor according to claim 2, wherein the first conductive film is disposed on a surface of the first source away from the first gate and the surface of the side of the first insulating layer away from the first gate, and the semiconductor layer is disposed on a surface of a side of the first conductive film on the first insulating layer away from the first gate.

5. The thin film transistor according to claim 1, wherein the first source is disposed on a surface of the side of the first insulating layer away from the first gate, the first conductive film is disposed on a surface of a side of the first source away from the first gate, and the semiconductor layer is disposed on a surface of a side of the first conductive film away from the first gate.

6. The thin film transistor according to claim 1, wherein the first drain is stacked on the surface of the side of the semiconductor layer away from the first gate, and the second conductive film is disposed between the first drain and the semiconductor layer.

7. A thin film transistor, comprising:
    a first gate;
    a first insulating layer covering the first gate;
    a first source disposed at a side of the first insulating layer away from the first gate in a vertical direction perpendicular to an upper surface of the first gate;
    a semiconductor layer disposed at the side of the first insulating layer away from the first gate;
    a first drain disposed at the side of the first insulating layer away from the first gate;
    a second insulating layer covering the first drain, the semiconductor layer, and the first source; and
    a second gate disposed on a surface of a side of the second insulating layer away from the first gate in the vertical direction,
    wherein the first source, the semiconductor layer, and the first drain jointly constitute a vertical channel structure,
    wherein in a horizontal direction parallel to the upper surface of the first gate, the first source and the semiconductor layer are spaced apart and the second insulating layer is disposed between the first source and the semiconductor layer, and
    wherein the semiconductor layer does not overlap the first source in the vertical direction.

8. The thin film transistor according to claim 7, wherein the first source is electrically connected to a surface of a side of the semiconductor layer close to the first gate, and the first drain is electrically connected to a surface of a side of the semiconductor layer away from the first gate.

9. The thin film transistor according to claim 8, wherein the first source is electrically connected to the surface of the side of the semiconductor layer close to the first gate through a first conductive film, and the first conductive film has at least one through hole.

10. The thin film transistor according to claim 9, wherein the first conductive film is an indium tin oxide film with the at least one through hole or a metal film with the at least one through hole.

11. The thin film transistor according to claim 9, wherein the first conductive film is a silver nanowire film.

12. The thin film transistor according to claim 9, wherein the first source and the semiconductor layer are both disposed on a surface of the side of the first insulating layer away from the first gate, the first conductive film extends from a surface of the first source to the surface of the side of the semiconductor layer close to the first gate, and at least partially covers the surface of the first source and at least partially covers the surface of the side of the semiconductor layer close to the first gate.

13. The thin film transistor according to claim 9, wherein the first source is disposed on a surface of the side of the first insulating layer away from the first gate, the first conductive film is disposed on a surface of a side of the first source away from the first gate, and the semiconductor layer is disposed on a surface of a side of the first conductive film away from the first gate.

14. The thin film transistor according to claim 9, wherein the first drain is disposed on the surface of the side of the semiconductor layer away from the first gate and partially covers the semiconductor layer, an orthographic projection of the second gate at least partially overlaps an orthographic projection of the semiconductor layer, and the orthographic projection of the second gate does not overlap an orthographic projection of the first drain.

15. The thin film transistor according to claim 9, wherein the first drain is stacked on the surface of the side of the semiconductor layer away from the first gate, and a second conductive film is disposed between the first drain and the semiconductor layer, and the second conductive film has at least one through hole.

16. The thin film transistor according to claim 15, wherein the second conductive film is an indium tin oxide film with the at least one through hole or a metal film with the at least one through hole.

17. A light-emitting diode (LED) backplane, comprising at least one thin film transistor, wherein each of the at least one thin film transistor comprising:
a first gate;
a first insulating layer covering the first gate;
a first source disposed at a side of the first insulating layer away from the first gate in a vertical direction perpendicular to an upper surface of the first gate;
a semiconductor layer disposed at the side of the first insulating layer away from the first gate;
a first drain disposed at the side of the first insulating layer away from the first gate;
a second insulating layer covering the first drain, the semiconductor layer, and the first source; and
a second gate disposed on a surface of a side of the second insulating layer away from the first gate in the vertical direction,
wherein the first source, the semiconductor layer, and the first drain jointly constitute a vertical channel structure, the first source is electrically connected to a surface of a side of the semiconductor layer close to the first gate through a first conductive film, the first drain is electrically connected to a surface of a side of the semiconductor layer away from the first gate through a second conductive film, the first conductive film is a silver nanowire film, and the second conductive film is a silver nanowire film,
wherein in a horizontal direction parallel to the upper surface of the first gate, the first source and the semiconductor layer are spaced apart and the second insulating layer is disposed between the first source and the semiconductor layer, and
wherein the semiconductor layer does not overlap the first source in the vertical direction, and
wherein the thin film transistor serves as a driving thin film transistor of an LED.

18. The LED backplane according to claim 17, wherein the LED is a mini-LED.

19. The LED backplane according to claim 17, wherein the LED backplane comprises a two transistors and one capacitor (2T1C) circuit structure, and the 2T1C circuit structure comprises:
the driving thin film transistor;
a switching thin film transistor, comprising a third gate, a second source, and a second drain, wherein the third gate is configured to receive a first scan signal, and the second source is configured to receive a data signal;
a storage capacitor, wherein a terminal of the storage capacitor is connected to a second drain of the switching thin film transistor, and another terminal of the storage capacitor is grounded; and
the light-emitting diode (LED),
wherein the first gate of the driving thin film transistor is connected to the second drain of the switching thin film transistor, the second gate of the driving thin film transistor is configured to receive a second scan signal, the first source of the driving thin film transistor is connected to a terminal of the LED, another terminal of the LED is configured to receive a working voltage signal, and the first drain of the driving thin film transistor is grounded.

* * * * *